(12) United States Patent
Arbel et al.

(10) Patent No.: US 10,346,346 B1
(45) Date of Patent: Jul. 9, 2019

(54) INLINE ECC FUNCTION FOR SYSTEM-ON-CHIP

(71) Applicant: Xilinx, Inc., San Jose, CA (US)

(72) Inventors: Ygal Arbel, Morgan Hill, CA (US); Ian A. Swarbrick, Santa Clara, CA (US); Sagheer Ahmad, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 43 days.

(21) Appl. No.: 15/851,449

(22) Filed: Dec. 21, 2017

(51) Int. Cl.
| G06F 15/78 | (2006.01) |
| G06F 11/10 | (2006.01) |
| G06F 13/16 | (2006.01) |
| G11C 29/52 | (2006.01) |

(52) U.S. Cl.
CPC ...... *G06F 15/7825* (2013.01); *G06F 11/1068* (2013.01); *G06F 13/1668* (2013.01); *G11C 29/52* (2013.01)

(58) Field of Classification Search
CPC .................................................. G06F 15/7825
See application file for complete search history.

(56) References Cited

U.S. PATENT DOCUMENTS

| 7,143,332 | B1 | 11/2006 | Trimberger |
| 7,200,235 | B1 | 4/2007 | Trimberger |
| 7,380,197 | B1 | 5/2008 | Goolsby |
| 7,523,380 | B1 | 4/2009 | Trimberger |
| 7,620,875 | B1 | 11/2009 | Nelson et al. |
| 9,632,869 | B1 | 4/2017 | Lu et al. |
| 10,223,216 | B1 * | 3/2019 | Dubeyko ............ G06F 11/1658 |
| 2010/0158005 | A1 * | 6/2010 | Mukhopadhyay .... H04L 49/109 370/392 |
| 2010/0158023 | A1 * | 6/2010 | Mukhopadhyay .. G06F 15/7825 370/401 |
| 2010/0161938 | A1 * | 6/2010 | Heddes ................... G06F 15/16 712/11 |
| 2010/0162265 | A1 * | 6/2010 | Heddes ................... G06F 9/542 719/314 |
| 2010/0191911 | A1 * | 7/2010 | Heddes ................... G06F 15/16 711/118 |
| 2011/0078222 | A1 * | 3/2011 | Wegener ................. H03M 7/30 708/203 |
| 2012/0079154 | A1 * | 3/2012 | Mangano ............ G06F 13/1626 710/112 |
| 2013/0111295 | A1 | 5/2013 | Li et al. |
| 2015/0143036 | A1 | 5/2015 | Kogge et al. |
| 2015/0278004 | A1 | 10/2015 | Li et al. |
| 2015/0301890 | A1 | 10/2015 | Marshall et al. |
| 2017/0193142 | A1 * | 7/2017 | Boutillier .............. G06F 17/509 |
| 2018/0052766 | A1 * | 2/2018 | Mehra .................... G06F 3/0625 |
| 2018/0121121 | A1 * | 5/2018 | Mehra .................... G06F 3/0604 |
| 2018/0293174 | A1 * | 10/2018 | Song .................... G06F 12/0246 |
| 2018/0358989 | A1 * | 12/2018 | Mehra ............... H03M 13/6505 |

\* cited by examiner

Primary Examiner — Joseph D Torres
(74) Attorney, Agent, or Firm — Robert M. Brush

(57) ABSTRACT

An example integrated circuit (IC) includes a network-on-chip (NoC), a master device coupled to the NoC, a memory controller coupled to the NoC configured to control a memory coupled to the IC, and an inline error-correcting code (ECC) circuit coupled to the NoC. The ECC circuit is configured to receive read and write transactions from the master device that target the memory, compute ECC data based on the read and write transactions, and provide outgoing transactions to the memory controller.

20 Claims, 7 Drawing Sheets

US 10,346,346 B1

INLINE ECC FUNCTION FOR SYSTEM-ON-CHIP

TECHNICAL FIELD

Examples of the present disclosure generally relate to electronic circuits and, in particular, to an inline error-correcting code (ECC) function for a system-on-chip (SoC).

BACKGROUND

Error-correcting code (ECC) protection of dynamic random access memory (DRAM) is traditionally implemented using extra "out-of-band" data bits (e.g., 64 bits of data plus 8 bits of parity). This approach is costly due to the requirement for one or more DRAM components for storing the ECC data and the additional interface input/output (IO) pins.

In addition, bus structures have been found to be unsuitable for some system on chip (SoC) integrated circuits (SoCs). With increases in circuit integration, transactions can become blocked and increased capacity can create signaling problems. In place of a bus structure, a network on chip (NoC) can be used to support data communications between components of the SoC.

A NoC generally includes a collection of switches that route packets from source circuits ("sources") on the chip to destination circuits ("destinations") on the chip. The layout of the switches in the chip supports packet transmission from the desired sources to the desired destinations. A packet may traverse multiple switches in transmission from a source to a destination. Each switch can be connected to one or more other switches in the network and routes an input packet to one of the connected switches or to the destination.

SUMMARY

Techniques for an inline error-correcting code (ECC) function for a system-on-chip (SoC) are described. In an example, an integrated circuit (IC) includes: a network-on-chip (NoC); a master device coupled to the NoC; a memory controller coupled to the NoC configured to control a memory coupled to the IC; and an inline error-correcting code (ECC) circuit coupled to the NoC, the ECC circuit configured to receive read and write transactions from the master device that target the memory, compute ECC data based on the read and write transactions, and provide outgoing transactions to the memory controller.

In another example, a method of memory management in an integrated circuit (IC) includes: receiving a transaction from a master device at an inline error-correcting code (ECC) circuit through a network-on-chip (NoC), the transaction targeting a memory coupled to the IC; determining ECC data based on the transaction at the inline ECC circuit; and providing one or more outgoing transactions to a memory controller coupled to the NoC configured to control the memory.

In another example, an integrated circuit (IC) includes a processing system; a programmable logic region; a network-on-chip (NoC) coupling the processing system and the programmable logic region; a master device coupled to the NoC; a memory controller coupled to the NoC configured to control a memory coupled to the IC; and an inline error-correcting code (ECC) circuit coupled to the NoC, the ECC circuit configured to receive read and write transactions from the master device that target the memory, compute ECC data based on the read and write transactions, and provide outgoing transactions to the memory controller.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
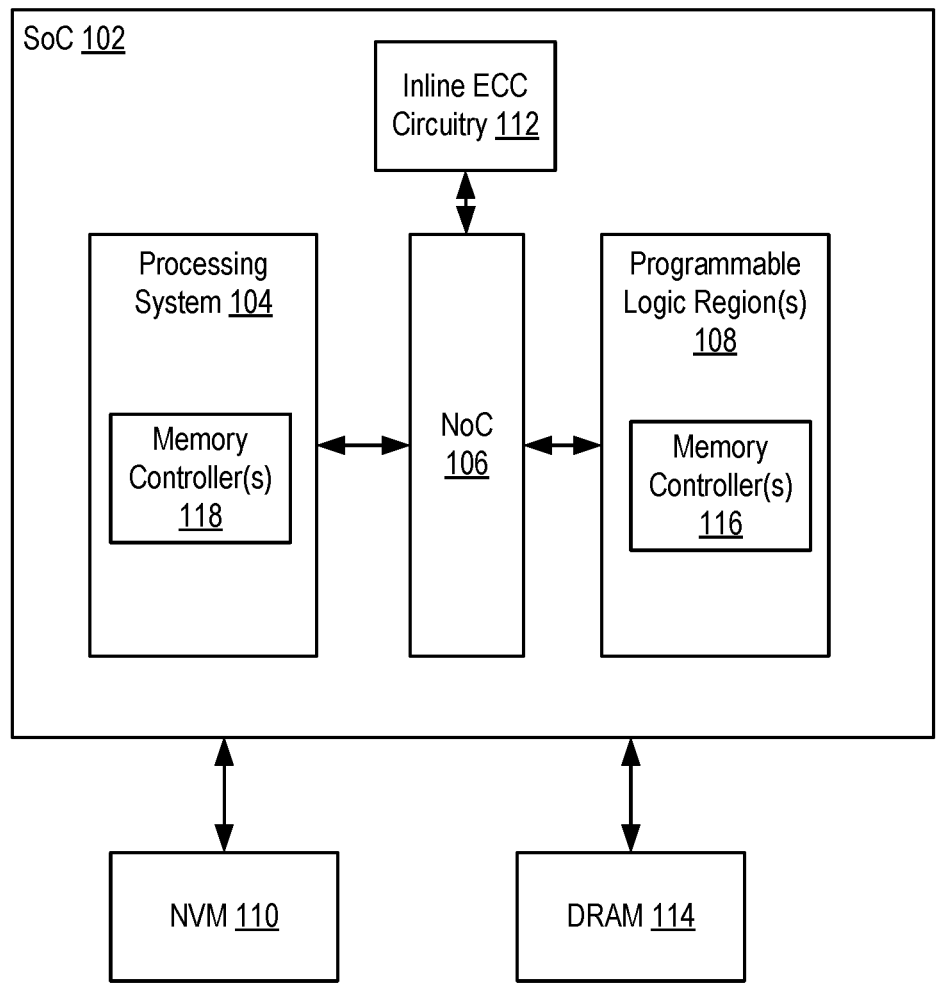
FIG. 1 is a block diagram depicting a system-on-chip (SoC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting a system-on-chip (SoC) 102 according to an example. The SoC 102 is an integrated circuit (IC) comprising a processing system 104, a network-on-chip (NoC) 106, inline error-correcting code (ECC) circuitry 112, and one or more programmable regions 108. The SoC 102 can be coupled to external circuits, such as a nonvolatile memory (NVM) 110 and dynamic random access memory (DRAM) 114. In an example, the processing system 104 includes one or more memory controllers 118 for controlling the NVM 110 and/or the DRAM 114. In another example, the programmable logic region(s) 108 include one or more memory controller(s) 116, implemented as either hardened circuits or as configurable logic, for controlling the NVM 110 and/or the DRAM 114. In still other examples, the SoC 102 includes both the memory controller(s) 118 and the memory controller(s) 116.

The NVM 110 can store data that can be loaded to the SoC 102 for configuring the SoC 102, such as configuring the NoC 106 and the programmable logic region(s) 108. The DRAM 114 can store data used by the various circuits in the SoC 102, including the processing system 104 and any circuits configured in the programmable logic regions 108. Examples of the processing system 104, the NoC 106, and the programmable logic region(s) 108 are described below. In general, the processing system 104 is connected to the programmable logic region(s) 108 through the NoC 106.

The inline ECC circuitry 112 provides an inline ECC function such that an additional ECC component is not required on the DRAM 114. In some techniques, an inline ECC function can be implemented as part of the memory controller(s) 118 and/or the memory controller(s) 116. However, in examples described herein, the inline ECC function is implemented as a separate circuit (the inline ECC circuitry 112) attached to the NoC 106. This provides for a modular approach, which decouples the complex DRAM controller circuitry from the inline ECC function. This technique can be used with hardened DRAM controllers, soft DRAM controllers (e.g., DRAM controllers configured in the programmable logic region(s) 108), as well as with other types of memories (e.g., static RAM (SRAM) or any other type of RAM. The inline ECC circuitry 112 can be added or removed from any system implementation used in the SoC 102 with minimal impact. The inline ECC circuitry 112 also provides more flexibility as to where and how the ECC data is stored.

Figure 2:
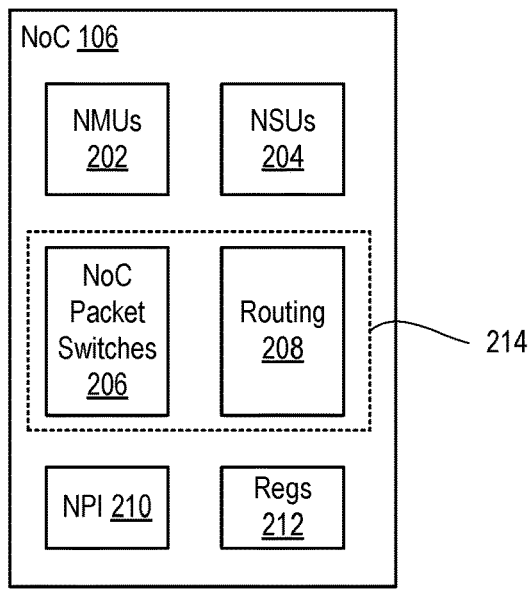
FIG. 2 is a block diagram depicting a network on chip (NoC) according to an example.

FIG. 2 is a block diagram depicting the NoC 106 according to an example. The NoC 106 includes NoC master units (NMUs) 202, NoC slave units (NSUs) 204, a network 214, NoC peripheral interconnect (NPI) 210, and registers (Regs) 212. Each NMU 202 is an ingress circuit that connects a master endpoint to the NoC 106. Each NSU 204 is an egress circuit that connects the NoC 106 to a slave endpoint. The NMUs 202 are connected to the NSUs 204 through the network 214. In an example, the network 214 includes NoC packet switches 206 and routing 208 between the NoC packet switches 206. Each NoC packet switch 206 performs switching of NoC packets. The NoC packet switches 206 are connected to each other and to the NMUs 202 and NSUs 204 through the routing 208 to implement a plurality of physical channels. The NoC packet switches 206 also support multiple virtual channels per physical channel. The NPI 210 includes circuitry to program the NMUs 202, NSUs 204, and NoC packet switches 206. For example, the NMUs 202, NSUs 204, and NoC packet switches 206 can include registers 212 that determine functionality thereof. The NPI 210 includes interconnect coupled to the registers 212 for programming thereof to set functionality. Configuration data for the NoC 106 can be stored in the NVM 110 and provided to the NPI 210 for programming the NoC 106.

Figure 3:
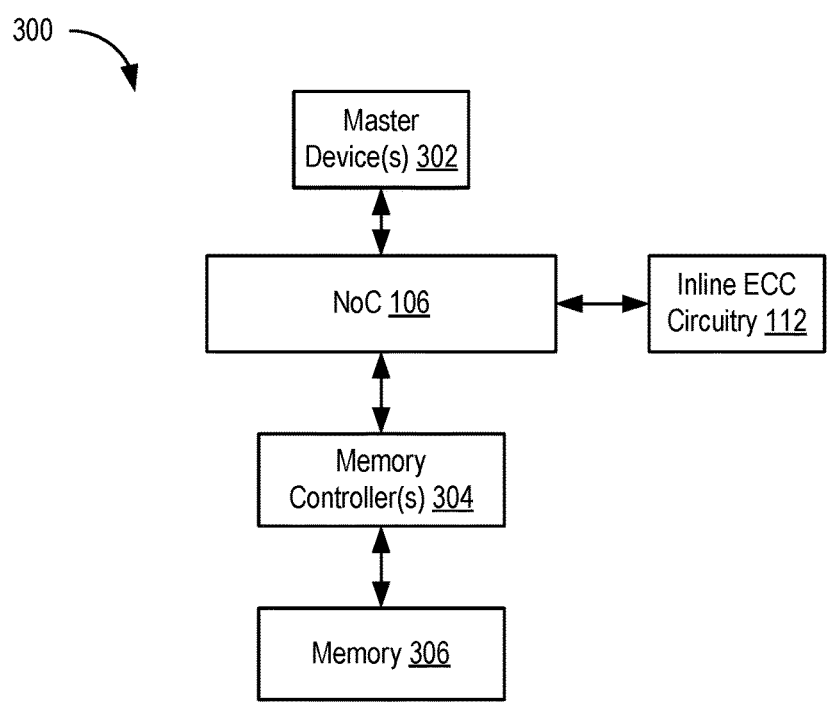
FIG. 3 is a block diagram depicting a memory system according to an example.

FIG. 3 is a block diagram depicting a memory system 300 according to an example. The memory system 300 includes one or more master device(s) 302, the NoC 106, one or more memory controllers 304, the inline ECC circuitry 112, and memory 306. The master device(s) 302 are circuits in the SoC 102, such as circuits in the processing system 104 or circuits in the programmable logic region(s) 108 (e.g., hardened circuits or configured circuits). The master device (s) 302 are coupled to NMUs 202 in the NoC 106. The memory controller(s) 304 are disposed in the processing system 104 and/or the programmable logic region(s) 108.

The memory controller(s) 304 are configured to control the memory 306. The memory 306 can include one or more memory modules, such as one or more DRAM modules, SRAM modules, and/or other types of memory modules. The NoC 106 routes memory transactions (e.g., read and write transactions) between the master device(s) 302 and the memory controller(s) 304.

In operation, one or more address ranges in the address space of the SoC 102 may be selected to be ECC-protected, while other portions of the address space can remain unprotected. Memory transactions to the unprotected regions may be routed directly between the master device(s) 302 and the memory controller(s) 304 via the NoC 106. Memory transactions to the ECC-protected regions are routed via the inline ECC circuitry 112, which manages the generation and checking of the ECC data in a manner that is transparent to both the master device(s) 302 and the memory controller(s) 304 (i.e., slave devices).

Figure 4:
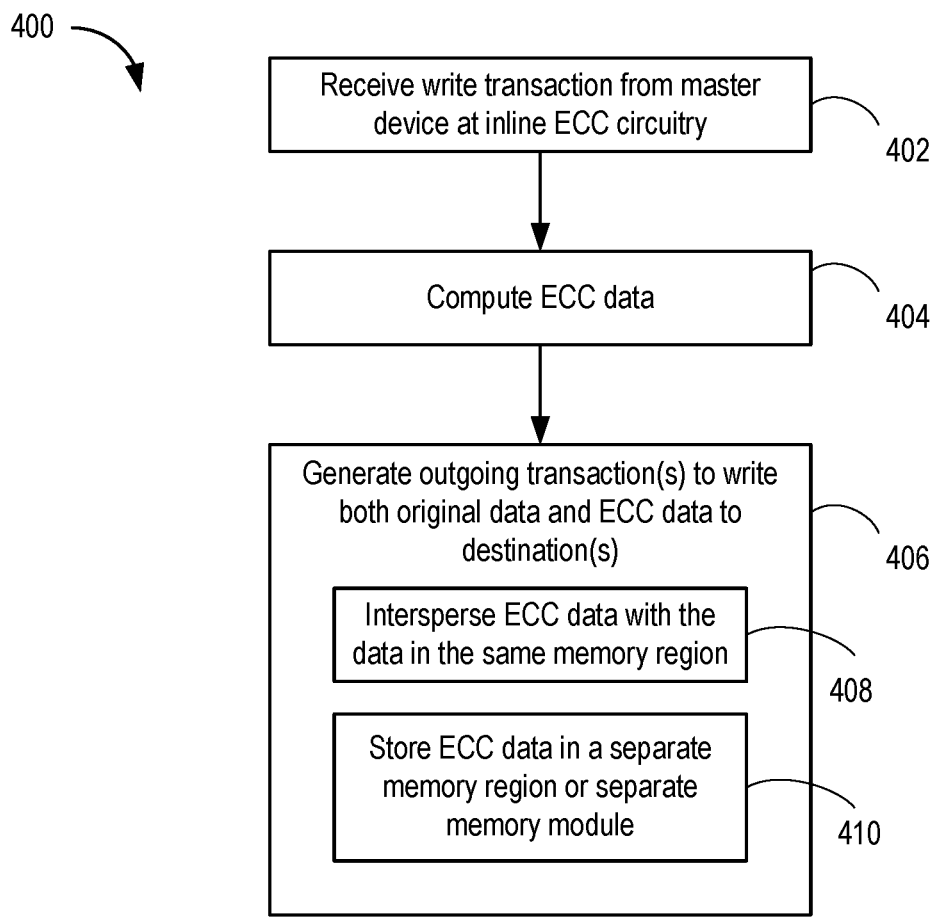
FIG. 4 is a method of processing an ECC write transaction according to an example.

FIG. 4 is a method 400 of processing an ECC write transaction according to an example. The method 400 begins at step 402, where the inline ECC circuitry 112 receives the write transaction from a master device 302. The write transaction includes data to be written to an addressed location in the memory 306. At step 404, the inline ECC circuitry 112 computes ECC data based on the data to be written (e.g., ECC parity data). At step 406, the inline ECC circuitry 112 generates one or more outgoing transactions to write both the original data and the ECC data to one or more destinations. In an example, at step 408, the inline ECC circuitry 112 intersperses the ECC data with the original data in the same memory region of the memory 306. In such case, the inline ECC circuitry 112 can generate a single outgoing transaction. For example, if the memory 306 is accessed in pages, both the original data and the ECC data can be stored in the same page(s).

In another example, at step 410, the inline ECC circuitry 112 stores the ECC data in a separate memory region in the same memory or separate memory module from the original data. In such case, the inline ECC circuitry 112 generates one transaction for the original data and another transaction to write the ECC data. For example, separate memory regions can be separate pages in the same memory. If a separate memory module is used, the separate memory module can be of the same type or a different type than the memory module used to store the original data.

Figure 5:
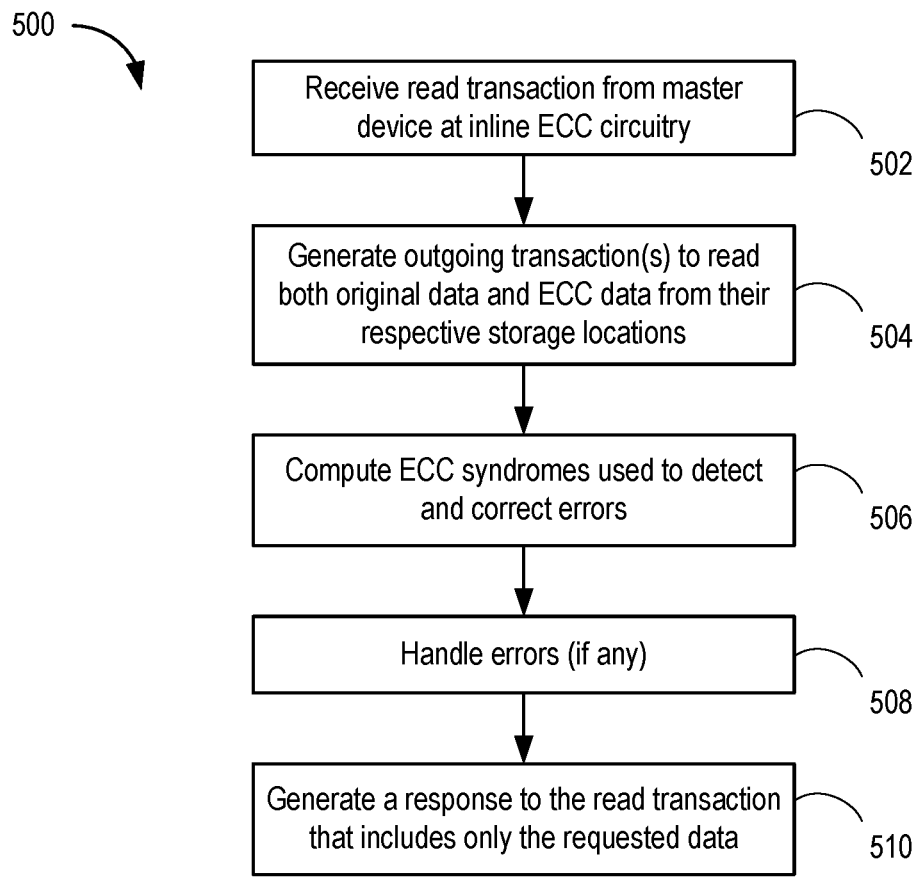
FIG. 5 is a flow diagram depicting a method of processing a read transaction according to an example.

FIG. 5 is a flow diagram depicting a method 500 of processing a read transaction according to an example. The method 500 begins at step 502, where the inline ECC circuitry 112 receives the read transaction from a master device 302. The read transaction includes an address in the memory 306 from which to read data. At step 504, the line ECC circuitry 112 generates one or more outgoing transactions to read both the original data and the ECC data from their respective storage locations. As noted above, the ECC data can be stored in the same memory region as the original data, in a different memory region, or in a different memory module. The inline ECC circuitry 112 generates one or more transactions for reading both the original data and the ECC data.

At step 506, the line ECC circuitry 112 computes the ECC syndromes used to detect and correct errors based on the ECC data and the original data. At step 508, the ECC circuitry 112 handles any errors in the original data based on the computed ECC syndromes. At step 510, the inline ECC circuitry 112 generates a response to the read transaction that includes only the requested data and sends the response to the master device 302. The ECC function is transparent to the master device 302 and the memory controller 304.

Figure 6:
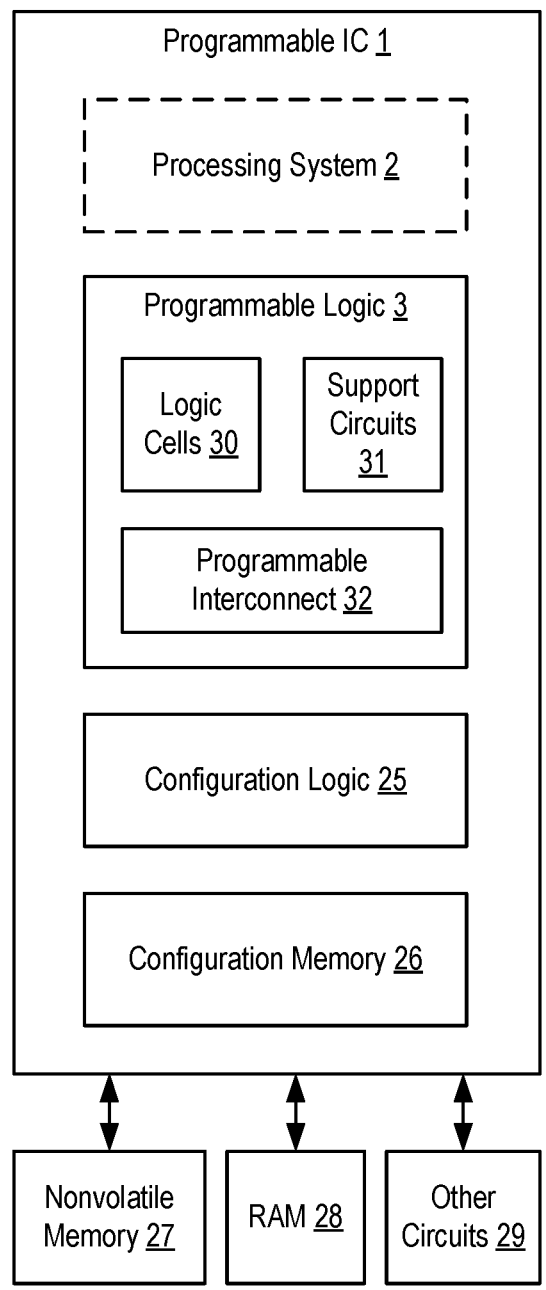
FIG. 6 is a block diagram depicting a programmable integrated circuit (IC) in which techniques described herein can be employed.

FIG. 6 is a block diagram depicting a programmable IC 1 according to an example in which the inline ECC circuitry 112 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 7:
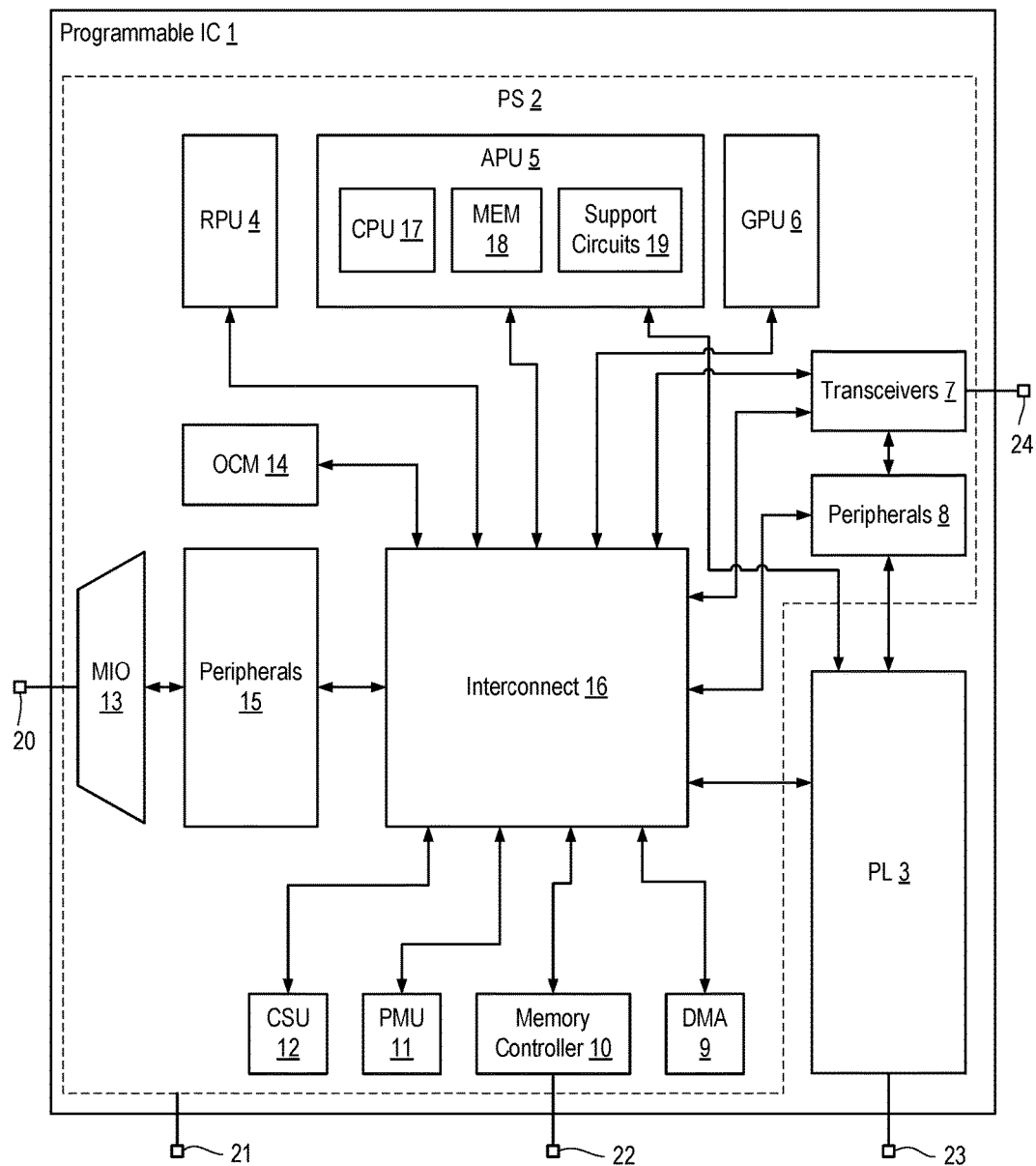
FIG. 7 is a block diagram depicting a System-on-Chip (SoC) implementation of a programmable IC according to an example.

FIG. 7 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed 10 (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19. The APU 5 can include other circuitry, including L1 and L2 caches and the like. The RPU 4 can include additional circuitry, such as L1 caches and the like. The interconnect 16 can include cache-coherent interconnect or the like.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 132 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose 10 (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 8:
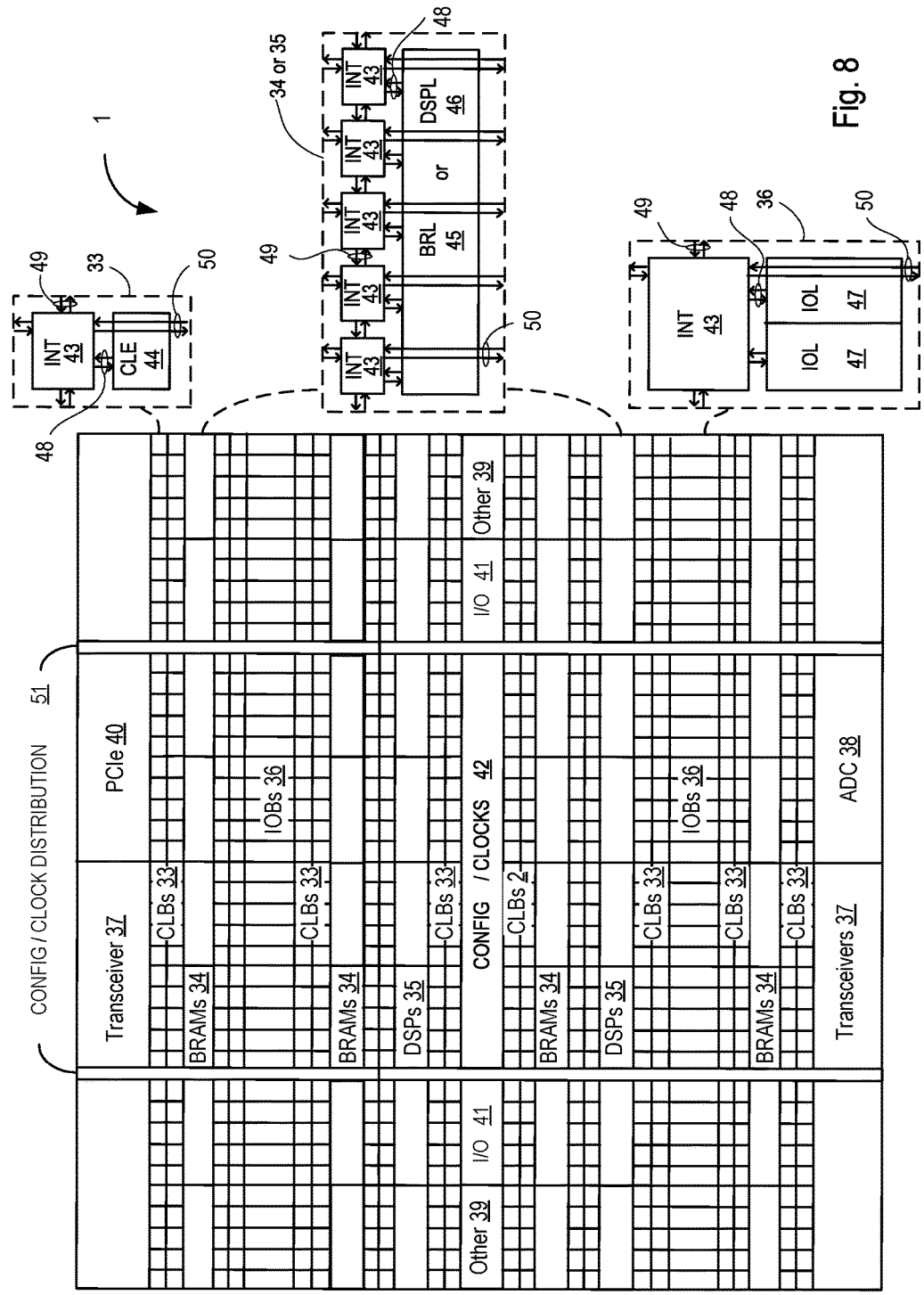
FIG. 8 is a schematic diagram of a field programmable gate array (FPGA) architecture in which techniques described herein can be employed.

FIG. 8 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 8. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 8) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. An integrated circuit (IC), comprising:
a network-on-chip (NoC);
a master device coupled to the NoC;
a memory controller coupled to the NoC configured to control a memory coupled to the IC; and
an inline error-correcting code (ECC) circuit coupled to the NoC, the ECC circuit configured to receive read and write transactions from the master device that target the memory, compute ECC data based on the read and write transactions, and provide outgoing transactions to the memory controller.

2. The IC of claim 1, wherein the inline ECC circuit is configured to:
receive a write transaction from the master device;
compute ECC data based on data in the write transaction; and
generate one or more outgoing transactions to write both the data and the ECC data to one or more destinations in the memory.

3. The IC of claim 2, wherein the one or more outgoing transactions includes a single outgoing transaction to write both the data and the ECC data to a region in a module of the memory.

4. The IC of claim 2, wherein the one or more outgoing transactions includes a first outgoing transaction to write the data to a first region of a module of the memory and a second outgoing transaction to write the data to a second region in the module of the memory.

5. The IC of claim 2, wherein the one or more outgoing transactions includes a first outgoing transaction to write the data to a first module of the memory and a second outgoing transaction to write the data to a second module of the memory.

6. The IC of claim 1, wherein the inline ECC circuitry is configured to:
receive a read transaction from the master device;
generate one or more outgoing transactions to read both data and the ECC data from respective storage locations in the memory;
compute ECC syndromes from the ECC data; and
generate a response to the read transaction that includes the data.

7. The IC of claim 6, wherein the inline ECC circuitry is configured to:
handle one or more errors in the data using the ECC syndromes.

8. A method of memory management in an integrated circuit (IC), comprising:
receiving a transaction from a master device at an inline error-correcting code (ECC) circuit through a network-on-chip (NoC), the transaction targeting a memory coupled to the IC;
determining ECC data based on the transaction at the inline ECC circuit; and
providing one or more outgoing transactions to a memory controller coupled to the NoC configured to control the memory.

9. The method of claim 8, wherein the transaction is a write transaction, wherein the ECC data is determined based on data in the write transaction, and wherein the one or more outgoing transactions are configured to write both the data and the ECC data to one or more destinations in the memory.

10. The method of claim 9, wherein the one or more outgoing transactions includes a single outgoing transaction to write both the data and the ECC data to a region in a module of the memory.

11. The method of claim 9, wherein the one or more outgoing transactions includes a first outgoing transaction to write the data to a first region of a module of the memory and a second outgoing transaction to write the data to a second region in the module of the memory.

12. The method of claim 9, wherein the one or more outgoing transactions includes a first outgoing transaction to write the data to a first module of the memory and a second outgoing transaction to write the data to a second module of the memory.

13. The method of claim 8, wherein the transaction is a read transaction, and wherein the one or more outgoing transactions are configured to read both data and the ECC data from respective storage locations in the memory, and wherein the method further comprises:
computing ECC syndromes from the ECC data; and
generating a response to the read transaction that includes the data.

14. The method of claim 13, wherein the method further comprises:
handling one or more errors in the data using the ECC syndromes.

15. An integrated circuit (IC), comprising:
a processing system;
a programmable logic region;
a network-on-chip (NoC) coupling the processing system and the programmable logic region;
a master device coupled to the NoC;
a memory controller coupled to the NoC configured to control a memory coupled to the IC; and
an inline error-correcting code (ECC) circuit coupled to the NoC, the ECC circuit configured to receive read and write transactions from the master device that target the memory, compute ECC data based on the read and write transactions, and provide outgoing transactions to the memory controller.

16. The IC of claim 15, wherein the master device is disposed in the processing system.

17. The IC of claim 15, wherein the master device is disposed in the programmable logic region.

18. The IC of claim 17, wherein the master device is configured in the programmable logic region.

19. The IC of claim 15, wherein the inline ECC circuit is configured to:
  receive a write transaction from the master device;
  compute ECC data based on data in the write transaction; and
  generate one or more outgoing transactions to write both the data and the ECC data to one or more destinations in the memory.

20. The IC of claim 15, wherein the inline ECC circuitry is configured to:
  receive a read transaction from the master device;
  generate one or more outgoing transactions to read both data and the ECC data from respective storage locations in the memory;
  compute ECC syndromes from the ECC data; and
  generate a response to the read transaction that includes the data.

\* \* \* \* \*